United States Patent [19]

Arrington et al.

[11] Patent Number: 4,459,546
[45] Date of Patent: Jul. 10, 1984

[54] ELECTRONIC KILOWATTHOUR METER

[75] Inventors: Robert A. Arrington, Richardson, Tex.; Richard A. Nelson; James L. Thomas, both of Placentia, Calif.

[73] Assignee: Rockwell International Corporation, El Segundo, Calif.

[21] Appl. No.: 203,781

[22] Filed: Nov. 3, 1980

[51] Int. Cl.³ .................... G01R 21/06; G06G 7/16
[52] U.S. Cl. ................................ 324/142; 328/160; 364/483; 364/841
[58] Field of Search .................. 324/142, 99 D, 141; 364/483, 841–848, 830; 328/160

[56] References Cited

U.S. PATENT DOCUMENTS 4,282,576  8/1981  Elms et al. ........................ 324/142

OTHER PUBLICATIONS

Depping et al; "Electrical Energy Meter . . . "; Electronics to Microelectronics; Fourth European Conference on Electrotechnics; Eurocon '80; Stuttgart, Germany; Mar. 24–28, 1980.
Kuppurajulu et al; "A Fast Response . . . "; IEEE Trans. on Power Apparatus and Systems; vol. PAS-90; No. 1; Jan./Feb. 1971; pp. 331–338.
Stockton, J. R.; "Proposed Quarter Squares . . . "; Electronics Letters; vol. 16; No. 21; Oct. 9, 1980; pp. 819–820.
Burton et al; "Linear and Nonlinear . . . "; IEEE Trans. on Instrum. and Meas.; vol. IM-24; No. 3; Sep. 1975; pp. 201–205.

Primary Examiner—Ernest F. Karlsen
Attorney, Agent, or Firm—V. Lawrence Sewell; Howard R. Greenberg; H. Fredrick Hamann

[57] ABSTRACT

An electronic meter is disclosed, for measuring functions such as power and energy of an alternating current and voltage. For measuring electrical energy, the meter includes an analog integrator for computing the integral of the voltage and of the current over a selected period of the voltage waveform. Means including a digital microprocessor and a comparison circuit are provided for generating a voltage level equal to the magnitude of the current integral or the voltage integral. In this manner, the microprocessor determines the value of the voltage or current integral. Since the integral of a sinusoidal waveform is related to its amplitude and to the power factor, the microprocessor can make a computation of energy from the values of the voltage and current integrals.

11 Claims, 6 Drawing Figures

ELECTRONIC KILOWATTHOUR METER

BACKGROUND OF THE INVENTION

This invention relates to an electronic meter for measuring functions, such as power and energy, of an alternating voltage and current to an electrical load.

Electronic kilowatthour meters have the potential to provide more accurate measurement of energy than the electro-mechanical rotating disk type of meter which is currently in use. However, for an electronic meter to supplant the electromechanical meter, it must be a highly reliable and economical device as well. As variety of circuits have been conceived in pursuit of these objectives.

One of the general approaches to the problem is to integrate the product of the instantaneous value of the voltage and the instantaneous value of the current. Another approach takes into account the basically sinusoidal waveforms of the voltage and current, and computes power as the product of the peak amplitude of the voltage, the peak amplitude of the current and the power factor. The present invention is an approach which generally falls into the latter category.

If energy is to be computed by multiplying peak voltage, peak current and power factor, it is desirable to avoid having to make a separate determination of the phase angle or power factor. One solution to this problem is found in the U.S. Pat. No. 4,056,774 to Shum. In that patent, a meter samples the voltage at its peak and also samples the current at the peak of the voltage waveform. It turns out that the current thus sampled is equal to the peak current amplitude times the power factor. This value can then be multiplied by the voltage to compute power and energy.

In the present invention, it is recognized that (1) the integral of a half cycle of the voltage is proportional to is peak amplitude and (2) the integral of the current between zero crossings of the voltage waveform is directly proportional to the peak amplitude of the current multiplied by the power factor. Accordingly, such integrals can be used to compute power or energy. Circuit means have been conceived which allow a microprocessor to derive the integral values from an analog integrator in order to perform the necessary power and energy computations.

SUMMARY OF THE INVENTION

In accordance with the present invention, there is provided an electronic meter which includes an analog integrator for computing the integral of an alternating voltage between the zero crossings of the voltage. The integrator is also used to compute the integral of the current. For the measurement of power or energy, the current is integrated between the zero crossings of the voltage waveform. Means are provided for generating a voltage level equal to the magnitude of the voltage integral or the current integral, so that a processor can determine the value of each integral and compute the power or energy from these values.

The meter of the present invention possesses advantages compared to the prior art. For example, in comparison with the Shum patent referenced above, there is avoided the necessity for detecting the peak of the voltage waveform. As a practical matter, it is generally easier to detect zero crossings, than the peak of a waveform. In addition, measuring a peak value places a great deal of emphasis on a sample of the waveform at one instant, whereas the present invention utilizes information from, preferably, a half cycle of the measured waveform. The present invention represents an economical approach in the means provided for entering the values obtained by analog integrators into a digital processor.

DESCRIPTION OF PREFERRED EMBODIMENTS

If a sinusoidal voltage is integrated over a half cycle, the magnitude of the resulting integral is equal to twice the maximum amplitude of the voltage. If a sinusoidal current, out of phase with the voltage is integrated over a half cycle of the voltage, the magnitude of the resulting integral is twice the maximum amplitude of the current times the power factor. The average power delivered to a load by this current and voltage is equal to one-half the product of the maximum amplitude of the voltage, the maximum amplitude of the current and the power factor. Thus, the power can be computed from the values of the current integral and the voltage integral. In particular, the average power would equal one-eighth of the product of the described voltage integral and current integral.

Figure 1:
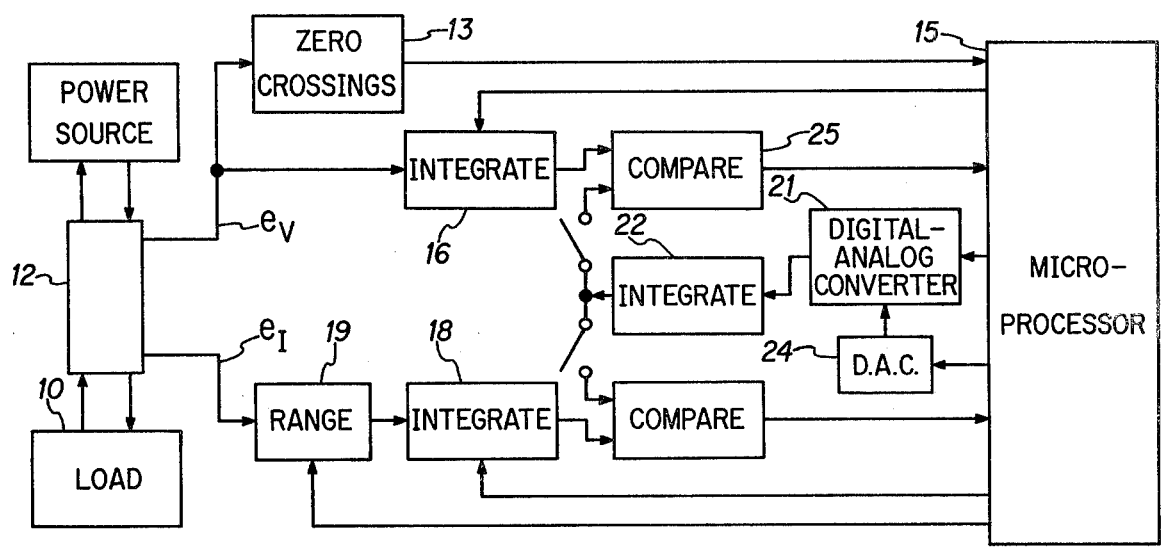
FIG. 1 is a block diagram of a first embodiment of a meter according to the invention.
Figure 2:
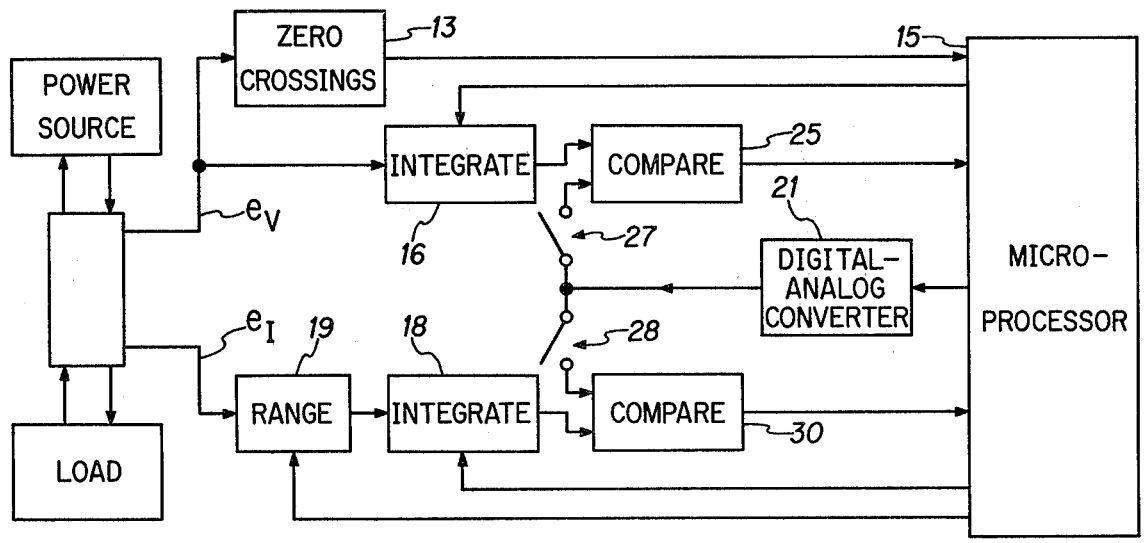
FIG. 2 is a block diagram of a second embodiment of a meter in accordance with the invention.
Figure 3:
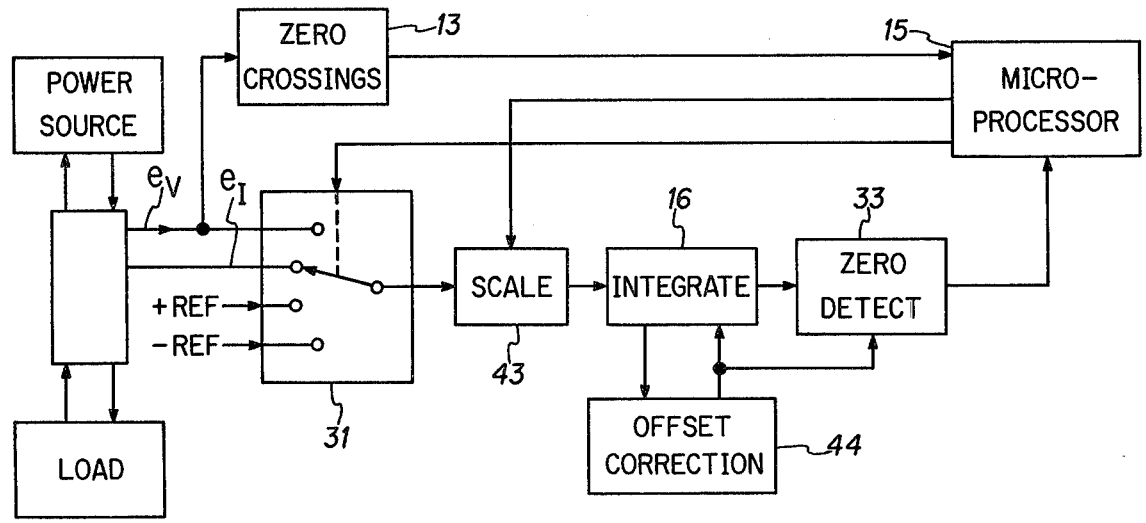
FIG. 3 is a block diagram of a third embodiment of a meter in accordance with the invention.

A recognition of the above relationships has been employed to provide several embodiments of an electronic meter for measuring power and energy. In addition, the meter can be adapted to measure volt amperes and reactive volt amperes. The embodiments of FIGS. 1-3 are discussed in terms of measuring power to a load 10. In each case, current and voltage transformers 12 provide signals $e_V$ and $e_I$ proportional respectively to the voltage and current supplied to the load 10.

In the meter of FIG. 1, a zero crossings detector 13 provides a microprocessor 15 with the timing of the voltage signal zero crossings and an indication of whether the crossing is in the positive or negative direction. The microprocessor uses this input to control an analog integrator 16 to integrate the voltage signal $e_V$ for the half period between its zero crossings. Similarly, the current signal $e_I$ is integrated between zero crossings of the voltage signal by integrator 18. Since the size of the current signal is relatively unpredictable compared to that of the voltage, a scaling or range circuit 19 is controlled by the microprocessor to provide an input of suitable size for integrator 18.

The result obtained by integrator 16 or integrator 18 is compared with another integral initiated by microprocessor 15. The microprocessor outputs a sinusoid in digital form to a digital-to-analog converter (DAC) 21. The converter 21, in turn, provides an analog sinusoidal signal to an analog integrator 22. A second digital analog converter 24 is used to provide a selectable reference voltage to converter 21. This reference voltage controls the gain of the converter 21. The digital-to-analog converter 24 receives its digital input from the microprocessor, and utilizes a fixed reference voltage.

Integrator 22 provides an integral of a reference sinusoidal signal over the half period between its zero crossings, for comparison with the integral obtained by integrator 16 or integrator 18. The comparison with the result obtained by integrator 16 is made by compare circuit 25. If the integrals obtained by integrator 16 and 22 are not the same, then microprocessor 15 changes the input to digital-to-analog converter 24, which changes the reference voltage input to converter 21. As a result, converter 21 provides a sinusoidal signal of a different amplitude to integrator 22 to produce an output from integrator 22 which more nearly matches the output of integrator 16. When the compare circuit 25 indicates that the integrals from integrators 16 and 22 are the same, then the microprocessor 15 can determine the magnitude of the integral, from the magnitude of the digital signal sent to digital-to-analog converter 24.

When the microprocessor 15 has made a determination of the value of both the current integral and the voltage integral, it can compute power in accordance with the previously described relationship. To calculate energy, microprocessor 15 must account for the passage of time, preferably with a real time clock. It can then accumulate power measurements made over known time intervals to arrive at an energy figure.

The meter of FIG. 2 differs from that of FIG. 1, in that the output of digital-to-analog converter 21 is connected directly to compare circuit 25 by switch 27 and to compare circuit 30 by switch 28, under the control of microprocessor 15. In the system of FIG. 2, the microprocessor applies to digital-to-analog converter 21 a constant digital value for a fixed period. If the output of converter 21 does not equal the output of the integrator 16 or 18 to which it is being compared, then the microprocessor 15 applies a different constant value to converter 21. When the appropriate compare circuit 25 or 30 finally detects that the output of digital-to-analog converter 21 is the same as the output of the integrator being compared, then the microprocessor 15 can determine the value of the current or voltage integral from the final digital value it provided to converter 21.

The meter of FIG. 2 is advantageous compared to that of FIG. 1, in that the microprocessor 15 is not tied up generating a sinusoid as an input to digital-to-analog converter 21. Further, one of the digital to analog converters 24 is eliminated.

A different type of operation is obtained if the system of FIG. 2 is modified by substituting an integrator for digital to analog converter 21. It is possible to generate from the microprocessor an analog voltage which can be switched from zero to a fixed value for a precisely measurable time interval, thus being a sort of pulse width modulated (PWM) signal. This voltage is applied as the input to the new integrator which has been substituted for converter 21. During comparison of the output of the new integrator with the output of integrator 16 or 18, the fixed nonzero value of the voltage is output by the microprocessor, until its integral is found equal to the output of integrator 16 or 18 by compare circuits 25 or 30. At that point, the microprocessor switches to zero the voltage it is applying to the new integrator. By determining the time required for the known voltage from the microprocessor to produce an integral equal to the integral of $e_V$ or $e_I$, the microprocessor can determine the value of the $e_V$ or $e_I$ integral.

FIG. 3 shows another embodiment of a meter which uses the integral of a pulse width modulated signal for comparison. This same embodiment is shown in greater detail in FIG. 5, with waveforms in FIG. 4 illustrating its operation.

The meter of FIG. 3 employs only one analog integrator 16. The voltage and current signals $e_V$ and $e_I$ are applied to integrator 16 when selected by switch 31 under the control of microprocessor 15. A range or scaling circuit 19 is provided as in the other embodiments. The use of one integrator for both the current and voltage signals represents a circuit economy, as does the elimination of digital-to-analog converters and the substitution of a zero detect circuit for two comparators.

Figure 4:
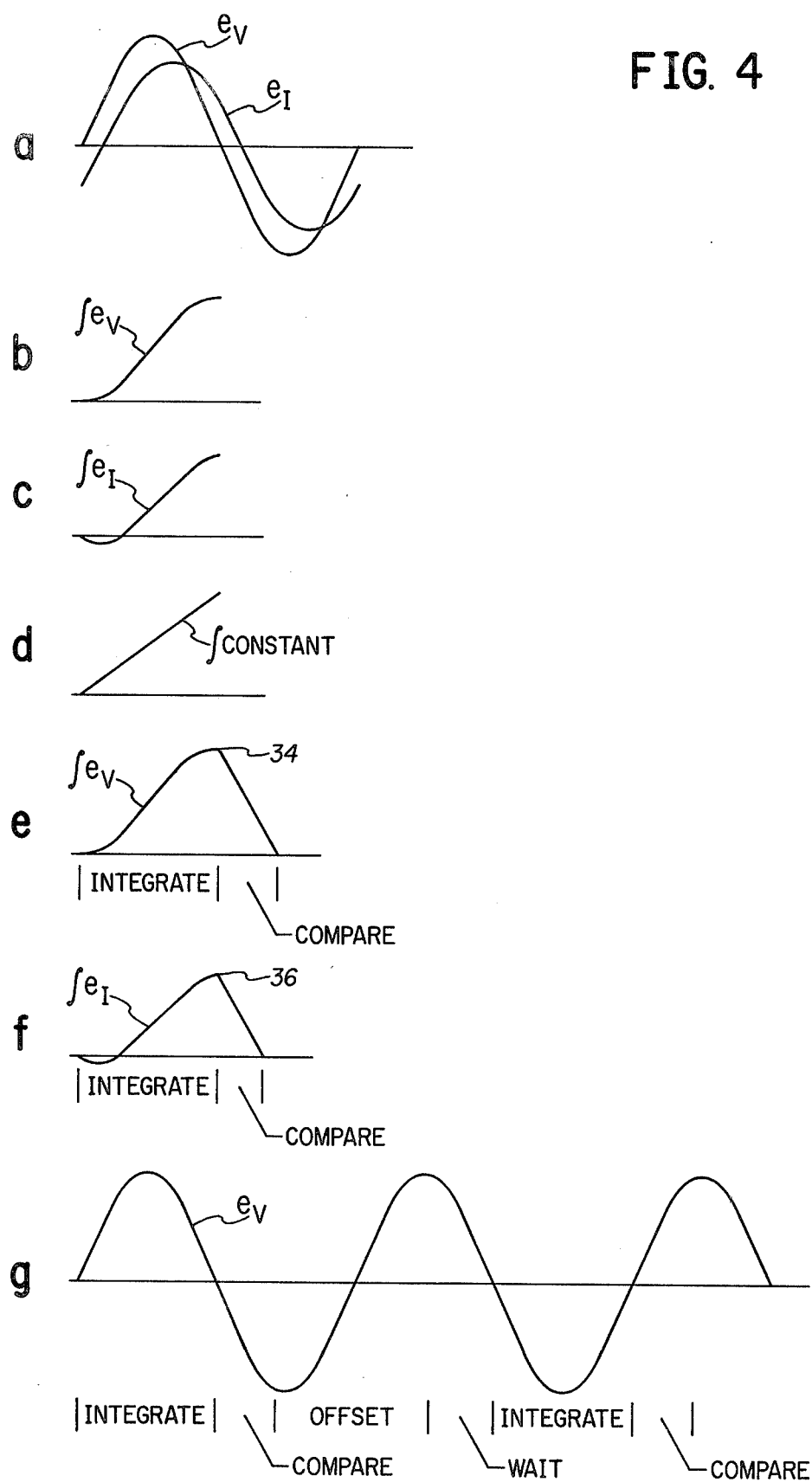
FIG. 4 is a set of waveforms illustrating the operation of the meter of FIG. 3.

FIG. 4 shows the variation with time of waveforms found in the meter of FIG. 3. FIG. 4a shows a voltage signal $e_V$ and current signal $e_I$ of the type measured by the meter of FIG. 3. FIG. 4b illustrates the output of analog integrator 16 integrating the voltage signal during its positive half cycle. FIG. 4c illustrates the output of the integrator 16 integrating the current signal over the positive half cycle of the voltage. FIG. 4d shows the output of the integrator 16 upon the selection of the constant input +REF by switch 31 under the control of microprocessor 15.

FIG. 4e shows the output of integrator 16 when the constant reference voltage −REF is selected by switch 31, at the end of the positive half cycle of the voltage. As can be seen on FIG. 4e, the output of the integrator is decreased to zero by the −REF signal input. Zero detect circuit 33 detects when the output of integrator 16 does reach zero and signals this event to microprocessor 15. The microprocessor 15 employs its internal counter to accurately measure the length of time from the end of the positive half cycle of the voltage, until zero is detected by circuit 33. The number of timer counts corresponding to this interval is representative of the value 34 of the integral in FIG. 4e at the end of the positive half cycle of the voltage. It is in this way that microprocessor 15 in the meter of FIG. 3 determines the value of the voltage and of the current integrals obtained by analog integrator 16.

FIG. 4f shows the comparable process for determining the final value 36 of the integral of the current signal at the end of the positive half cycle of the voltage. Note that there is a shorter period required to drive the output of integrator 16 to zero, since the current integral value 36 is less than the voltage integral value 34. If the integral were being performed over the negative half cycle of the voltage, then the reference signal +REF would have to be applied through scaling circuit 19 to integrator 16 to drive the output of the integrator back to zero.

Figure 5:
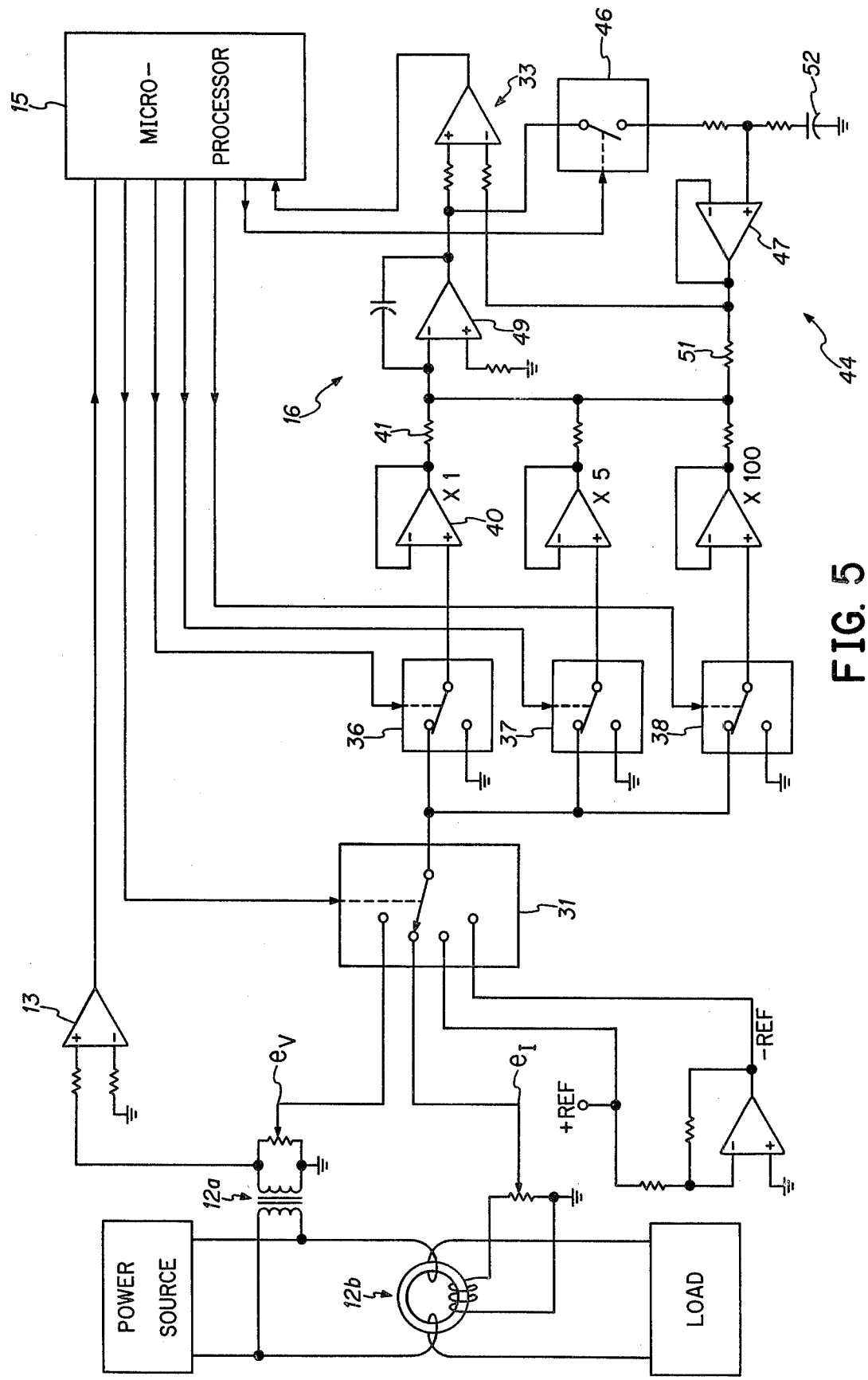
FIG. 5 is a schematic diagram of the meter of FIG. 3.

FIG. 5 shows additional circuit details of the embodiment of FIG. 3. A voltage transformer 12a provides a voltage signal $e_V$. Zero crossing detector 13 is embodied by an operational amplifier which compares an output of the voltage transformer with ground. A current transformer 12b provides $e_I$. The voltage and current signals are selectable by switch 31 under the control of microprocessor 15. Also brought to switch 31 are the reference voltage +REF and, provided by an operational amplifier circuit, the negative reference voltage −REF.

The selected output of switch 31 goes to switches 36, 37 and 38, which are under control of microprocessor 15. Each of the switches is connected to a different one of three input circuits to integrator 16. Each such input circuit includes an operational amplifier, such as amplifier 40, in a unity gain configuration and an input resistor such as resistor 41. The input resistors are selected to provide gains of X 1, X 5 and X 100 as indicated in the figure, thereby providing the scaling function indicated by reference numeral 43 in FIG. 3.

The meter of FIGS. 3 and 5 includes a circuit 44 which provides an offset correction for integrator 16 and zero detection circuit 33. In operation, the integrator 16 is periodically zeroed to reestablish the offset correction. At these times, microprocessor 15 commands switches 36-38 to connect to ground and causes switch 46 to connect the output of integrator 16 through an input resistor to operational amplifier 47. Amplifier 47 and amplifier 49 of integrator 16 are connected in negative feedback relationship to one another, so that amplifier 47 outputs a voltage which drives amplifier 49 through resistor 51 in such a way as to correct for the offset. Microprocessor 15 then resets the switches, in particular opening switch 46, so that capacitor 52 holds the voltage that it developed while switch 46 was closed. As a result, during subsequent operation, operational amplifier 47 continues to provide the offset correction to amplifier 49. Zero detect circuit 33, comprised of an operational amplifier with balanced input resistors, compares the output of integrators 16 not with zero but with the offset correction output of amplifier 47.

FIG. 4g illustrates a preferred sequence of events in the operation of the meter of FIGS. 3 and 5. The first portion of the voltage waveform is the positive half cycle, during which the waveform is integrated. During the next period, the reference voltage is being integrated as in FIG. 4e, driving the output of integrator 16 to zero, while zero detect circuit 33 is performing its compare function. After circuit 33 detects zero, then the previously described offset correction circuit 44 is engaged to prepare for the next integration operation. After the completion of the offset operation, the circuit waits for the beginning of the negative half cycle of the voltage to initiate integration of the waveform for that period.

Figure 6:
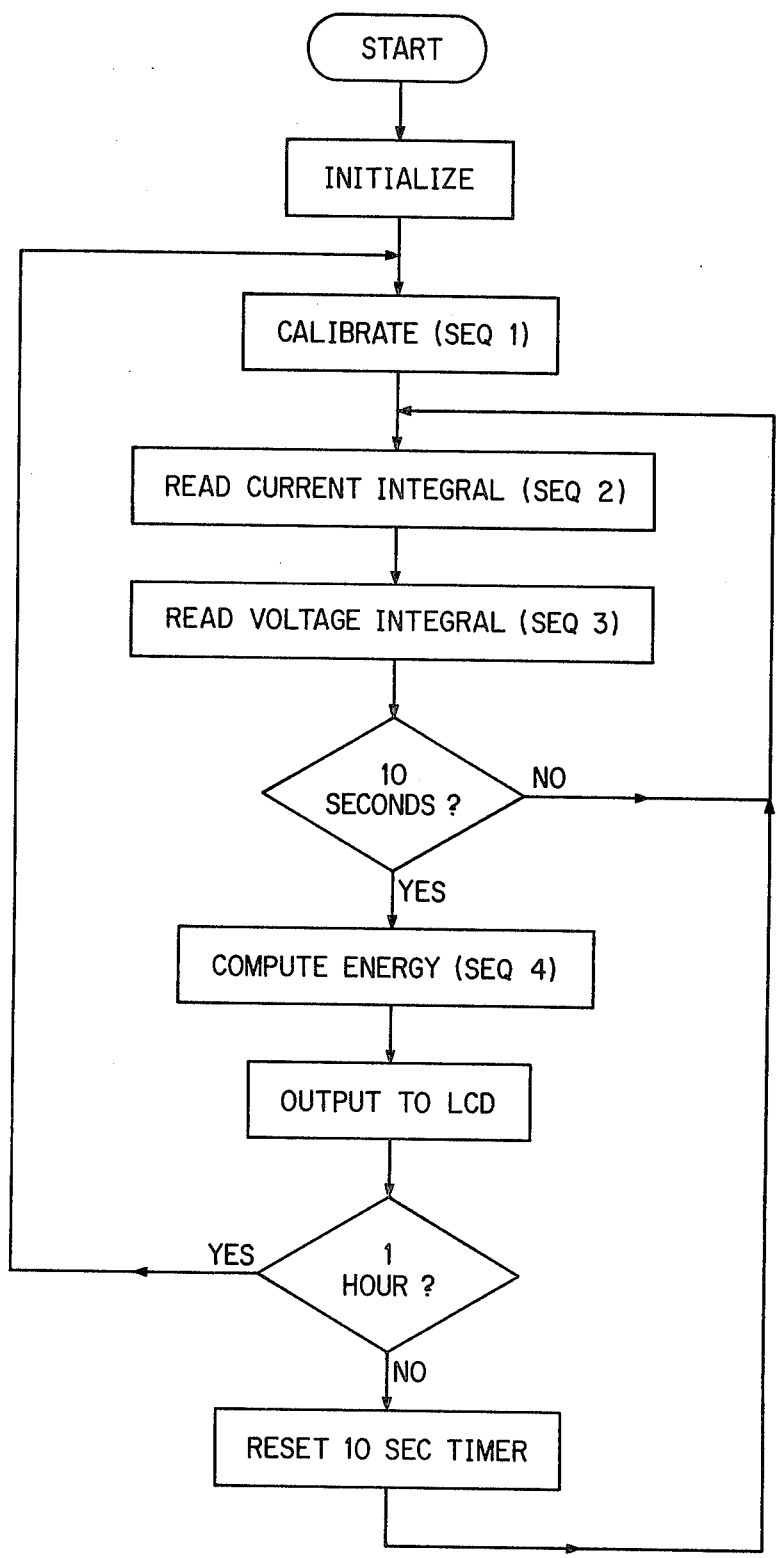
FIG. 6 is a flow chart of the operation of a microprocessor in the meter of FIG. 3.

FIG. 6 is a flow chart of the operation of the meter of FIGS. 3 and 5, as controlled and executed by microprocessor 15. Details of several of the blocks of FIG. 6 are given in Sequences 1-4 hereinbelow. After some basic initialization steps, the meter enters the following calibration sequence.

Sequence 1. Calibrate
 1.1 Zero the integrator
 1.2 Perform the integration and compare functions, using the reference input. Repeat four times and compute the average number of timer counts which corresponds to the integrated reference value. Perform for each scale, X1, X5, X100.
 1.3 Calculate K1 (volt sec/timer count) for each scale, X5, X5, X100.

After the integrator is zeroed, one of the reference potentials, for example, the positive reference potential is applied to the integrator. This will be done for each of the scales, X 1, X 5 and X 100. At the end of a selected period of integration, the opposite polarity reference potential is applied to the integrator, while microprocessor 15 counts the time required for the opposite polarity voltage to bring the integrator down to zero, as detected by the zero detector 33. Since the value of the reference potential and the integration period are known, the microprocessor 15 can compute a calibration constant K1, expressed in volt seconds per timer counts. Then, subsequently, when microprocessor 15 determines the number of timer counts required to drive an integral value to zero, it can calculate the integral value in terms of volt seconds.

Sequence 2. Read Current Integral
 2.1 Check scale and change if necessary.
 2.2 Make 16 sets of integrated current readings (in terms of timer counts), each set including a positive half cycle (of the voltage) and a negative half cycle.
 2.3 Average the magnitude of the readings, convert to ampere seconds and add to sum of such converted averages previously read during present 10 sec. interval.

In making a current integral reading, it is important to run a test reading to make sure the best scale, X 1, X 5 or X 100 is selected. Then a number of sets of current integral readings are made and averaged together. In this preferred embodiment, 16 sets of readings are performed. Since the current can have less of an ideal waveform than the voltage, the accuracy of the metering can be improved by taking this relatively large number of current readings. In the preferred embodiment of FIG. 6, readings and averages are accumulated over a ten second period, before an energy computation is made. The value of ten seconds is not a critical value, and a wide choice of such intervals is available.

Sequence 3. Read Voltage Integral
 3.1 Make 2 sets of integrated voltage readings (in terms of timer counts), each set including a positive half cycle and a negative half cycle.
 3.2 Average the magnitudes of the readings, convert to volt seconds, and add to sum of such converted averages previously read during present 10 second interval.

For the voltage integral, it is not necessary to make as many readings, since the voltage waveform is very nearly the ideal sinusoid. However, it will be noted that in the preferred embodiment both positive half cycles and negative half cycles integration are measured. Like the current integral values, the voltage values are averaged and accumulated over a ten second interval.

Sequence 4. Compute Energy
 4.1 Multiply ampere seconds accumulated during previous 10 seconds by accumulated volt seconds.
 4.2 Convert the result of step 4.1 to kWh for 10 seconds and add to accumulated computed kWh total.

Since the voltage integral is a multiple of the voltage amplitude, and the current integral is a multiple of the current amplitude times the power factor, these two integrals can be multiplied together along with a scale factor to obtain power. Multiplication by a different scale factor provides a computation of energy, since the time over which the readings were gathered is known. When energy is computed, it is added to the energy (kWh) previously accumulated. Power is simply displayed as a new computation. Depending upon the use of the meter, it may be important to display power computed over a shorter or longer interval than ten seconds.

The embodiment of FIG. 3 has an operational advantage compared with the embodiments of FIGS. 1 and 2. In the circuits of FIGS. 1 and 2, the microprocessor must generate voltage levels of various magnitudes until one of the levels equals the integral to which it is compared. In the circuit of FIG. 1, each sinusoid generated by the microprocessor must be integrated over a half cycle, so a number of half cycles are required. In the meter of FIG. 2, constant levels are generated by the microprocessor. These do not necessarily consume more time than the measurement of FIG. 3. The method of FIG. 3 is however simpler or more straightforward, since it does not require several iterations to perform one measurement.

The meters of FIGS. 1-3 use range circuits 19 and scaling circuit 43 to deal with the wide range of input current values which may be encountered. Another approach to dealing with this range of values is to use a scale which produces good results for the largest expected current value. Then smaller current values can be integrated over multiple positive (or negative) half cycles of the voltage without resetting the integrator, in order to obtain a larger integral value. At the end of the multiple integration periods, the comparison procedure is carried out. The number of multiple integrations employed is incorporated into computations of power or other quantities by the meter.

The meter of the present invention can be adapted to uses other than the measurement of power or energy. In particular, it could be used to compute volt amperes, by detecting the zero crossings of the current waveform and performing the current integration between those zero crossings. The voltage is integrated as for power.

To measure reactive volt amperes (VARS) current is integrated between $\pi/2$ and $3\pi/2$ of the voltage waveform, and voltage is integrated over its positive half cycle. Then the current is itegrated between $3\pi/2$ and $\pi/2$ of the voltage, and the voltage is integrated over its negative half cycle.

We claim:

1. An electronic meter for measuring a function, such as power, of a periodic alternating voltage and current to an electrical load, comprising:
   analog circuit means for computing the integral of said voltage as it varies over a first selected portion of the repetition period of said voltage;
   analog circuit means for computing the integral of said current as it varies over a second selected portion of said voltage period;
   means for measuring the relation of a reference signal to the magnitude of each of said integrals;
   means, responsive to said relation measured, for generating and controlling said reference signal;
   means for determining, from the reference signal generated, the values of each of said integrals; and
   means for receiving said integral values and multiplying them together to obtain a measure of said function.

2. The meter of claim 1, wherein said second portion is substantially the same as said first portion, thereby to permit the computation of power.

3. The meter of claim 1, wherein said means for measuring and generating and controlling include:
   means for providing a digital signal as said reference signal,
   means for converting said digital signal to an analog signal,
   means for computing an integral of said analog signal, and
   means for comparing said analog signal integral with said voltage integral and with said current integral, as said measuring.

4. The meter of claim 1, wherein said means for measuring and generating and controlling include:
   means for providing a digital signal as said reference signal,
   means for converting the digital signal to an analog signal, and
   means for comparing said analog signal with said voltage integral and with said current integral, as said measuring.

5. The meter of claim 1, wherein said means for measuring and generating and controlling include:
   analog circuit means for computing the integral of a said reference signal,
   means for detecting when the integral of the reference signal is equal to the integral of said voltage or of said current, and
   means for measuring the time required for the integral of said reference signal to become equal to the integral of said voltage or of said current.

6. The meter of claim 5, wherein said analog circuit means share an integrator, and said means for detecting includes means for beginning computing the integral of the reference signal at the end of computing the integral of the voltage or current, with the sign of the reference voltage selected so as to drive the output of the integrator to zero, and further includes means for detecting when said integrator output reaches zero.

7. An electronic meter for measuring energy, based on a periodic alternating voltage and current to an electrical load, comprising:
   means for detecting zero crossings of the waveform of said voltage;
   means, responsive to said detected crossings and including an analog integrator, for computing the integral of said voltage as it varies over the portion of said waveform which is between said zero crossings;
   means including said analog integrator for computing the integral of said current as it varies over said same portion of the voltage waveform;
   means for beginning to apply to said integrator at the end of said integral computing waveform portion a reference signal selected to drive the output of said integrator to zero and for accurately determining the time required to drive said output to zero; and
   means for determining the value of said voltage integral and said current integral from the corresponding times required to drive the integrator output to zero, for computing power from the values of said integrals and for accumulating computed values of power to calculate energy.

8. The meter of claim 7 wherein said means for computing power includes means for averaging a plurality of separately measured current integral values and multiplying the resulting average by the average of a plurality of separately measured voltage integral values.

9. The meter of claim 8, wherein said plurality of current integral values includes a value computed for a positive half cycle of said voltage and a value computed for a negative half cycle of the voltage.

10. The meter of claim 2, wherein said means for multiplying includes means for incorporating the passage of time to compute energy.

11. An electronic meter for measuring a function, such as power, of a periodic alternating voltage and current to an electrical load, comprising:
   means for computing the integral of a signal proportional to said voltage as it varies over a selected portion of the repetition period of said voltage;
   means for computing the integral of a signal proportional to said current as it varies over said same portion of the voltage period; and
   means for multiplying together said integral values to obtain a measure of said function.

* * * * *